April 1, 1969 H. VOGT 3,436,603

SEMICONDUCTOR ASSEMBLIES INCLUDING SEMICONDUCTOR UNITS WITH COOLING PLATES THEREFOR

Filed Oct. 24, 1965

United States Patent Office 3,436,603
Patented Apr. 1, 1969

3,436,603
SEMICONDUCTOR ASSEMBLIES INCLUDING SEMICONDUCTOR UNITS WITH COOLING PLATES THEREFOR

Herbert Vogt, Munich, Germany, assignor to Siemens Aktiengesellschaft, Berlin, Germany Filed Oct. 24, 1965, Ser. No. 504,303
Claims priority, application Germany, June 10, 1965, S 97,542; Aug. 20, 1965, S 98,953
Int. Cl. H02b *1/02*
U.S. Cl. 317—100 18 Claims

ABSTRACT OF THE DISCLOSURE

Semiconductor assembly includes at least one semiconductor unit having a disc-shaped housing including two metallic cover plates insulated from one another, and a semiconductor element slidably disposed between the cover plates, at least two resilient electrically conductive cooling plates having substantially central seat portions, spacer means of insulating material located between and engaging the cooling plates at two locations thereon disposed opposite one another respectively, and the spacer means having a thickness tending to urge the cooling plates to positions located a given distance from one another, the cover plates of the semiconductor unit housing being spaced from one another a distance greater than the given distance, the semiconductor unit being disposed between the cooling plates so that the cover plates of the housing are grippingly retained between the substantially central seat portions with a given pressure for affording relatively good thermal and electrical conduction from both sides of the semiconductor element to the cooling plates.

My invention relates to semiconductor assemblies.

In particular, my invention relates to an improved construction of a semiconductor assembly, particularly that type of assembly which includes semiconductor units constructed on the basis of semiconductor bodies made of germanium or silicon and in which the individual semiconductor units are connected with cooling plates to carry away in an effective manner the joule heat generated during operation of the assembly, so that each semiconductor unit is protected against electrical load surges and at the same time can be subjected to a relatively high specific electrical load.

In assemblies of this latter type it is desirable that when a plurality of such semiconductor units are united into a common assembly on a common carrier, in the event of trouble it should be a relatively easy matter to exchange one semiconductor element for another. Moreover, where a plurality of disc-shaped semiconductor units are combined together into such a semiconductor assembly, it has also proved to be desirable to arrange the cooling plates which are thermally and mechanically connected with the individual semiconductor elements in such a way that the mechanical influences acting on the cooling plates do not result in undesirable mechanical stressing of the semiconductor units which are connected with the cooling plates. Drawbacks of this latter type have particularly been encountered in cases where the individual semiconductor units are interchangeably arranged in a stack with cooling plates in such a way that the heat-transfer surfaces for transferring the heat from the semiconductor units to the cooling plates are situated within the surface area of the cooling plates which are subjected to expansion. The cooling plates of the latter type of assemblies extend in all directions from the surfaces of the semiconductor units and cooling plates which engage each other, outwardly beyond the semiconductor units so that a considerable portion of the periphery or even the entire periphery of the cooling plates project freely and thus are subjected at these peripheral edge portions to mechanical influences which are capable of being transmitted to the heat-transfer surfaces providing at the later corresponding mechanical stresses situated at the areas where the cooling plates and semi-conductor units engage each other.

It is a primary object of my invention to provide an assembly of semiconductor units of the above general type which will avoid the above drawbacks encountered in the cooperative relationship between the semiconductor units and the cooling plates therefor.

In particular, it is an object of my invention to provide a semiconductor assembly which makes it possible to very easily introduce into the assembly and remove therefrom any selected one or more of the semiconductor units, as required, while at the same time guaranteeing that when each unit is in the assembly it is in the proper heat-conductive and electrically conductive relationship with respect to the elements which engage each semiconductor unit.

It is furthermore an object of my invention to provide a construction where even though the structure which grips and holds the various components of the assembly together is electrically conductive, nevertheless it is maintained properly insulated from electrically conductive components of the assembly.

It is also an object of my invention to assemble together a series of cooling plates in such a way that any tilting movement of the cooling plates together with the semiconductor units engaged thereby is reliably avoided particularly at the areas where the cooling plates and semiconductor units are in thermal and electrical engagement with each other. Such undesirable tilting of the cooling plates and semiconductor units relative to each other at their areas of contact can occur as the result of undesirable force components in the assembly of cooling plates and semiconductor units, and the result of course would be very undesirable mechanical stressing of the semiconductor units.

The objects of my invention also include the provision of an assembly of the above type wherein the holding of the semiconductor units results not merely from the arrangement of the several cooling plates with respect to each other but also from the particular construction and material of the cooling plates themselves.

Furthermore, an object of my invention is to provide an assembly where the cooling plates serve at the same time as electrical conductors for the semiconductor units.

Furthermore, it is an object of my invention to provide cooling plates which are relatively stiff particularly at the areas where they engage the semiconductor units and which at the same time provide secure reliable supports for the semiconductor units.

Furthermore, it is an object of my invention to provide an arrangement where any desired number of cooling plates may be combined together to cooperate with a single semiconductor unit.

Thus, the objects of my invention include the provision of a structure where the required number of cooling plates necessary for proper cooling of a semiconductor unit can be arranged in heat-conductive relationship therewith.

The objects of my invention also include the provision of a construction which can operate efficiently both thermally and electrically even in the case where the opposed contact surfaces of the semiconductor unit and the cooperating surfaces of the cooling plates are not situated in precisely parallel planes.

In particular, it is an object of my invention to provide a construction where the cooling plate structure and the semiconductor units can automatically become adapted to each other so as to provide a highly efficient thermal and electrical cooperation between the semiconductor units and cooling plates.

In addition, it is an object of my invention to provide a construction where the contact between the cooling plates and semiconductor units cannot become situated undesirably at an edge of the semiconductor units but instead is reliably situated within the peripheral confines of the semiconductor units.

The semiconductor assembly of my invention will in general include a plurality of pairs of springy, electrically conductive cooling plates arranged in a row and a pair of electrically non-conductive spacers engaging each cooling plate at opposed edge portions thereof with the spacers arranged in two additional rows and situating the series of cooling plates at predetermined distances from each other. The several semiconductor units are respectively situated between and held by the pairs of cooling plates at portions of the latter which are situated from each other by distances less than the thickness of the semiconductor units when the latter are not situated between the pairs of cooling plates, so that upon spreading of a pair of cooling plates for the purpose of introducing a semiconductor unit between the latter and upon subsequent release of this pair of cooling plates, the cooling plates will press against the semiconductor unit with a force of predetermined magnitude which will guarantee that the desired thermal and electrical cooperation between the semiconductor units and cooling plates will be achieved.

My invention is illustrated by way of example in the accompanying drawings which form part of the application and in which.

Figure 1:
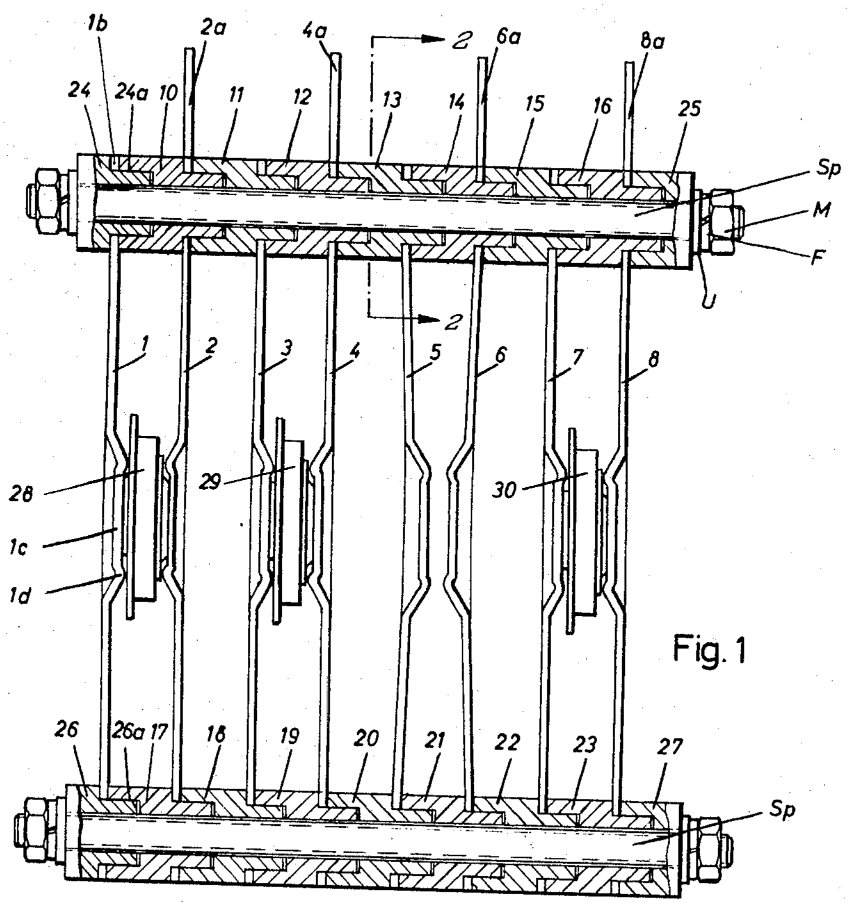
FIG. 1 is a sectional elevation of one possible embodiment of an assembly according to my invention in which the semiconductor units are illustrated as being diodes, the section of FIG. 1 being taken along line 1—1 of FIG. 2 in the direction of the arrows through the entire assembly, beyond the fragmentary illustration thereof in FIG. 2.

Referring now to FIG. 1, the cooling plates 1–8 are illustrated therein. These cooling plates are made of a springy electrically conductive sheet material such as a relatively hard copper, for example. Each of these cooling plates 1–8 is provided at opposed edge portions, indicated at upper and lower portions of each cooling plate in FIG. 1, with cutouts which enable the cooling plates 1–8 to be mounted on projecting portions of spacers 10–23 which are electrically non-conductive and which have projections capable of being introduced through the cutouts of the several cooling plates. These spacers 10–23 can be made of any suitable plastic which is not electrically conductive.

Figure 2:
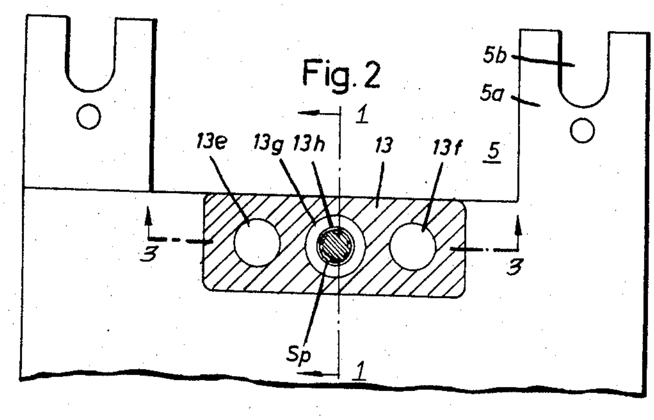
FIG. 2 is a transverse section of the structure of FIG. 1 taken along line 2—2 of FIG. 1 in the direction of the arrows and fragmentarily illustrating the structure at the region of one of the rows of spacers.
Figure 3:
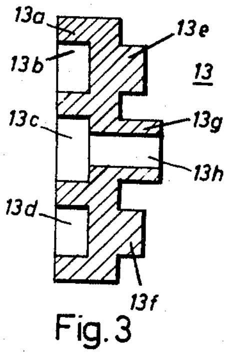
FIG. 3 is a sectional illustration of one of the spacers taken along line 3—3 of FIG. 2 in the direction of the arrows.

As may be seen from FIG. 3, each spacer, such as the spacer 13 shown therein, includes an insulating body **13*a* formed at its left face, as viewed in FIG. 3, with three recesses 13*b*, 13*c* and 13*d*. At its opposed right face, the insulating body 13*a* has the projections 13*e* and 13*f* as well as an intermediate projection 13*g* aligned with the recess 13*c* and formed with a through-bore 13*h* so that the projection 13*g*** has the construction of a tubular sleeve which is formed with the bore passing completely therethrough. These projections and recesses may, for example, have cylindrical configurations, as is apparent from FIG. 2.

In the illustrated example the several plates 1–8 are formed adjacent their opposed end edges, inwardly of these edges, with openings through which the projections **13*e*–13*g* respectively pass, in the manner indicated most clearly in FIG. 1, and the projections 13*e*–13*f* of one spacer are received in the recesses 13*b*–13*d*, respectively, of the next-following spacer, so that the two rows of spacers are arranged in the manner indicated in FIG. 1 with the several cooling plates 1–8 gripped therebetween and held spaced from each other thereby. The intermediate sleeve portions 13*g*** cooperate in the manner shown in FIG. 1 so as to form a continuous aperture at each row of spacers, and through this continuous bore formed by the nested row of spacers extends a compression bolt S*p*. Thus, with the construction of my invention each row of spacers is mounted on the compression bolt S*p* which is maintained insulated from the cooling plates 1–8 by the spacers themselves as indicated in FIG. 1.

The upper compressing bolt S*p* of FIG. 1 carries at one end a cup-shaped end element 25 receiving the projecting portion **13*g* of the spacer 16, while at its other end this upper compression bolt carries a sleeve element 24 having a portion 24*a* of reduced diameter extending into that recess of the first spacer 10 which corresponds to the recess 13*c*. The outer end faces of these end elements 24 and 25** are engaged by plain washers U which are in turn engaged by the springy lock washers F, and nuts M are threadedly carried by the ends of the compression bolt S*p* engaging the lock washers in the manner shown in the upper part of FIG. 1. In a corresponding manner elements 26 and 27, which are respectively identical with the elements 24 and 25, are mounted on the ends of the lower compression bolt of FIG. 1 and are engaged in the same way by plain washers which are in turn engaged by lock washers pressed thereagainst by the nuts shown at the lower part of FIG. 1.

In order to enable each cooling plate to function also as an electrical conductor for the semiconductor unit which it engages, the several cooling plates are respectively provided with projections situated at their upper portions, as viewed in FIG. 1 and capable of being connected with electrical conductors. Thus the projections **2*a*, 4*a*, 6*a* and 8*a* are shown in FIG. 1, whereas the corresponding projections are situated at the other sides of the intervening cooling plates 1, 3, 5, and 7 and do not appear in FIG. 1 since they are situated forwardly of the plane in which FIG. 1 is taken. However, the projection 5*a* of the plate 5 is apparent from FIG. 2. All these projections are formed with U-shaped notches, as shown for the notch 5*b* of the projection 5*a*** in FIG. 2, so that through corresponding threaded connections it is possible to connect electrical conductors to the cooling plates in these notches thereof clamped thereagainst by suitable bolts or nuts or the like.

Thus, each of the cooling plates is formed at opposed edge portions with a plurality of openings for receiving the projections of the spacers. These spacers are in turn nested within each other and mounted on the compression bolts. As a result the several cooling plates are gripped between the rows of spacers over relatively large areas of the cooling plates, and in addition because of the arrangement of the rows of spacers on the compression bolts, it is not possible for the cooling plates to become tilted as a result of mechanical stressing encountered at edge portions thereof.

Each cooling plate is deformed at its intermediate portion in such a way as to have a recess as shown for the recess **1*c* for the plate 1 in FIG. 1, and in this way the several cooling plates are respectively provided with increased mechanical stability at these deformed portions. Therefore, these parts of the cooling plates are particularly suited for engaging and holding the semiconductor units, gripping the latter in the manner shown for the units 28–30** in FIG. 1. These deformed intermediate portions are particularly adapted for the creation of transition surfaces between the semiconductor units and the cooling plates, at the outer housings of the semiconductor units, with these transition surfaces which engage each other having relatively large areas to provide very good thermal as well as electrical conductivity.

The recessed portion 1*c* of the cooling plate 1 has an inner part provided with a flat surface which is surrounded by a bead 1*d* providing not only a mechanical stability for the cooling plate, but also an outer radial limit on the area which can receive part of the semiconductor unit. This feature of plate 1 is, of course, repeated for the other plates, as is apparent from FIG. 1.

While the semiconductor units 28, 29 and 30 are illustrated in FIG. 1 respectively situated between the cooling plate pairs 1–2, 3–4, and 7–8, it will be noted that no semiconductor unit is shown in FIG. 1 between the cooling plate pair 5–6. This has been done in FIG. 1 so as to clearly illustrate that a pair of cooling plates between which no semiconductor unit is situated are located closer to each other than the other cooling plates which do engage semiconductor units. This result is brought about by providing the cooling plates with a somewhat dished configuration as shown for plates 5 and 6 in FIG. 1, and then arranging the cooling plates so that the dished portions approach each other. The several cooling plates, such as the plates 5 and 6, are made of a springy electrically conductive material, so that by spreading a pair of cooling plates apart from each other with a suitable tool, it is possible to space them from each other at their closet points by a distance somewhat greater than the thickness of the semiconductor unit to be situated therebetween. Then a semiconductor unit, such as the unit 28, for example, is introduced between the pair of spread-apart cooling plates which are then released so that they will, due to their inherent resiliency, move toward each other into pressing engagement with the semiconductor unit, and the springy force is such that the plates will engage the semiconductor unit with a pressure which will provide in a very effective manner the desired electrical and thermal cooperation between the cooling plates and the semiconductor units. These units are engaged at their end contact surfaces by the cooling plates in the example shown in FIG. 1.

Figure 4:
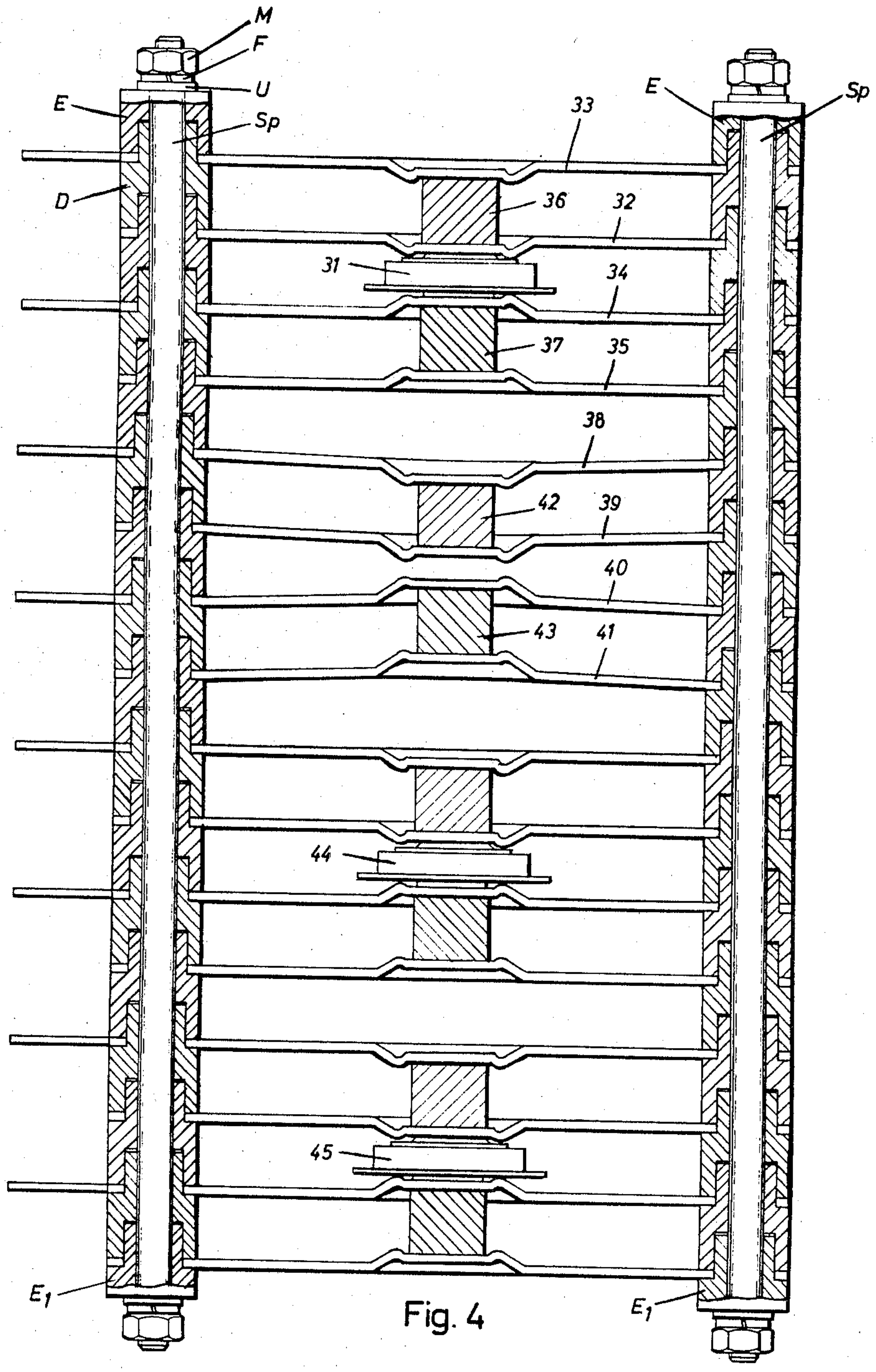
FIG. 4 is a sectional elevation of an assembly similar to that of FIG. 1 but showing how my invention can be adapted to provide a larger number of cooling plates for each semiconductor unit.

As has been indicated above, it is possible with my invention to provide a construction where more than two cooling plates are associated with each semiconductor unit, so that the required degree of cooling can be achieved, and such an arrangement is illustrated in FIG. 4. With this arrangement a second pair of cooling plates are provided for each pair of cooling plates which directly engage the semiconductor unit, so that each pair of cooling plates directly engaging a semiconductor unit is situated between and spaced from a second pair of cooling plates. In this way two cooling plates are situated at each side of each semiconductor unit for carrying heat away from the latter. Thus, it will be seen from FIG. 4 that the semiconductor unit 31 situated in the assembly of FIG. 4 is positioned between cooling plates 32 and 33 on one side, and between cooling plates 34 and 35 on the other side. All of these cooling plates have a structure such as that described above in connection with FIG. 1, and they are also mounted on spacer elements as described above and these spacer elements are in turn mounted on compression bolt assemblies also as described above.

The cooling plates 32 and 34 form the inner pair of cooling plates which directly engage the opposed surfaces of the semiconductor unit 31. Between the plate 33 and the plate 32 is provided a metal body 36 while a corresponding metal body 37 is situated between the plates 34 and 35. These bodies form spacer elements situated between and engaging the pair of cooling plates at each side of the semiconductor unit. Thus, it is apparent that for gripping and holding the semiconductor unit 31 from one side the cooling plates 32 and 33 are used in common as a single unit, while in the same way at the other side of the semiconductor unit 31 the two cooling plates 34 and 34 act in common as a single unit. Of course, when a semiconductor unit such as unit 31 is introduced into the assembly, the inner pair of cooling plates which directly engage the unit must be spread apart from each other with a corresponding spreading force sufficient to deflect the outer pair of cooling plates also, so that the semiconductor unit can then be situated between the inner pair of cooling plates which are then released to grip and hold the semiconductor unit in the manner described above.

The several spacers D are electrically non-conductive and have the structure described above in connection with FIG. 3, and these spacers cooperate with each other in the manner described above extending through openings of the several cooling plates. Of course, in this case additional spacers will be situated between the two cooling plates at each side of the semiconductor unit. The series of spacers D, which of course are electrically non-conductive, are situated between the end elements E and $E_1$ which correspond to the end elements 25 and 24, respectively, described above in connection with FIG. 1, and the compression bolts S*p* carry the same assembly of plain washers U, lockwashers F and nuts M.

FIG. 4 shows a pair of semiconductor units 44 and 45 in addition to the unit 31 and mounted in the same way. Also, FIG. 4 shows a group of cooling plates between which no semiconductor unit is situated. The latter group includes the plates 38–41 with the spacer elements 42 and 43 arranged as indicated in FIG. 4. Thus, the spacer element 42 is situated between and engages the plates 38 and 39, while the spacer element 43 is situated between and engages the plates 40 and 41. As is apparent from FIG. 4, the configuration of the cooling plates 38, 39 and 40 and 41 is such that the surface portions of the cooling plates 39 and 40 which are nearest to each other are spaced from each other by a distance which is less than the distance between the surface portions when a semiconductor unit is situated therebetween, so that a certain stressing of the plates is essential in order to space them from each other sufficiently to enable the semiconductor units to be situated therebetween, and this stressing is essential and desirable so that on the one hand from an electrical standpoint and on the other hand from a thermal standpoint there will be a good electrical and heat conductivity from the cooling plates to the semiconductor unit and in the reverse direction also.

Instead of an arrangement where the individual cooling plates are directly deformed mechanically at their intermediate surface portion so as to be stiffened and form suitable seats for the semiconductor units, it is also possible to provide an assembly where, within the framework of my invention, the individual cooling plates are provided with suitable cutouts for receiving mechanically stable inserts which can be riveted, soldered or welded to the cooling plates and which have a configuration which will fulfill the above functions in cooperation with the semiconductor units. Also, it is possible to provide on the surface of the cooling plate which is to cooperate with the semiconductor unit a stiffening plate which will function in the above-described manner in cooperation with the semiconductor units.

It is also possible in accordance with my invention to situate at those areas where the cooling plates are to be pressed against the semiconductor units special ductile inserts or layers, coatings, or the like, which can be joined to the cooling plate or to an element which stiffens the cooling plate as by being soldered thereto.

Figure 5:
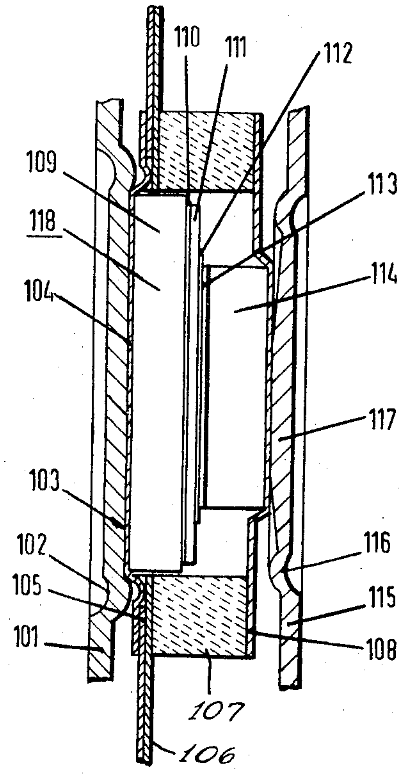
FIG. 5 is a fragmentary sectional elevation showing in detail the cooperation between a pair of cooling plates and a particular form of semiconductor unit situated therebetween.

Referring now to FIG. 5, there is shown therein a cooling plate 101 made, for example, of hard copper. This cooling plate is initially deformed at its outer side so as to provide the plate with the bead 102 at its inner side.

The configuration and size of this bead is such that it will form a seat determining the location of the semiconductor unit 118. This seat surface portion 103 of the cooling plate is directly engaged by a preferably ductile plate 104 made of silver, for example. This silver plate 104 is brazed or otherwise soldered to a ring member 105 which is capable of being welded. The ring 105 cooperates with a second ring member 106 which is also made of a material which is capable of being welded. This ring member 106 is connected with the ring member 105 at an outer edge portion of the ring member 106, for example by being welded in the presence of a protective gas, so as to provide a gas-tight closure for a housing of the semiconductor unit. The ring member 106 is joined at its inner area, by hard soldering, with a premetalized zone of an insulating ring 107. At the exterior surface of the insulating ring 107, which may be made, for example, of a ceramic material, there is a premetalized end face which by hard soldering is joined with a ductile cover plate 108 made of silver, for example. The pair of silver plates 104 and 108 are inwardly recessed so that in this way they form seats for the enclosed semiconductor element 118 which, from left to right, as viewed in FIG. 5, includes a molybdenum plate 109, and aluminum layer 110 alloyed thereto, a silicon plate 111, a gold-antimony electrode 112 alloyed thereto, and a silver plate 113 against the electrode 112 and interposed between the latter and a molybdenum plate 114. At the exterior surface of the silver plate 108, at a part thereof which is in alignment with the molybdenum disc 114, the cooling plate 115 is provided with a contacting surface portion.

This plate 115 is also provided with a bead 116. At the central portion of the area surrounded by the bead 116, the cooling plate 115 is deformed by a suitable pressing process, for example, so as to have an inner surface 117 of convex configuration extending in substantial parallel alignment with the seat surface portion 103, and it is this convex inner surface of the cooling plate 115 which presses against the exterior surface of the silver covering plate 108 of the housing of the semiconductor unit.

The pair of beads 102 and 116 thus take over the function of stiffening the cooling plates at their intermediate portions in a mechanical manner, since these beads will provide the cooling plates with a relatively great resistance to change in configuration. The pair of cooling plates 101 and 115 are made of a springy material, preferably hard copper, so that they will engage the semiconductor unit, such as the unit 118, with a predetermined pressure which will produce the above-described electrical and thermal cooperation which is desired between the cooling plates and the semiconductor units.

Of the pair of cover plates of the housing of the semiconductor unit shown in FIG. 5, at least that cover plate which engages the cooling plate 115, having the surface 117 of convex curvature, is made of a ductile material such as silver. This material, for example, can have a Vickers-hardness of 12 to 18 $kp.mm.^{-2}$. This latter cover plate of the housing has therefore a lesser hardness than that of the cooling plate, made of hard copper for example, with its convex portion, so that in the process of assembling the components made up of the pair of cooling plates and the semiconductor units situated therebetween, the convex surface of the cooling plate 115 will work itself into the softer covering plate of the semiconductor unit housing providing this softer covering plate at its exterior with a concave curvature exactly matching the convex curvature of the cooling plate 115 and engaging this latter convex surface, so that in this way a connection in the form of a ball-joint or the like is provided between the surfaces which directly engage and conform to each other.

Although in the assembly described above the compression bolts have been indicated as directly passing through sleeves portions of the spacers, it is of course also possible to provide constructions where the compression structure for holding the components of the entire assembly together is separate from the other elements and need not pass directly therethrough. Of course, the construction described above and shown in the drawings is preferred not only because of its compactness but also btcause of the stability with which it positions the various components preventing tilting thereof, for example, as pointed out above.

As for the cooling plates themselves, while they can have any desired polygonal configuration, it is also possible to provide them with edge portions which are curved. Moreover, instead of providing these cooling plates with openings situated inwardly of their edges for receiving the projections of the non-conductive spacers, it is also possible to provide the spacers with cutouts for receiving edge portions of the cooling plates or to provide the cooling plates with notches or other cutouts for receiving portions of the spacers. However, here again the particular construction shown in the drawings and described above is preferred because of its simplicity and reliability. Thus, as was pointed out above, the relatively large surface area of engagement between the spacers and the cooling plates achieved with the structure of my invention will guarantee that the cooling plates cannot become tilted with respect to the semiconductor units, at the areas of engagement therebetween, as a result of froces acting on edge portions of the cooling plates. It is to be noted that the intermediate deformed portions of the cooling plates serve not only to stiffen the cooling plates and form suitable seats for properly orienting and holding the semiconductor units with respect to the cooling plates, but in addition these deformed portions have a configuration which lends them to use with a suitable spreading tool for spreading apart from each other the pair of cooling plates which are to receive a semiconductor unit between themselves.

In the embodiment of FIG. 4 the various blocks such as the blocks 36 and 37 are soldered, for example, to the pair of plates at each side of the semiconductor unit so as to be connected thereto in a good heat-conductive relationship. Of course, for a good heat transfer it is possible to arrange these blocks, such as the blocks 36 and 37, simply between the successive cooling plates which then, for the purpose of providing a good heat transfer between the end faces of the blocks and the cooling plates can have additional ductible inserts or coatings situated at the cooling plates. Therefore, for the purpose of providing superior heat transfer it is possible to provide at the inner surfaces of the two cooling plates at each side of a semiconductor unit in FIG. 4, ductile coatings, inserts, or the like which directly engage the blocks such as the elements 36 and 37 to provide a good heat transfer engagement therewith.

I claim:

1. A semiconductor assembly comprising a plurality of pairs of springy electrically conductive cooling plates spaced from each other and arranged in a row, a pair of electrically non-conductive spacers engaging each cooling plate at the region of opposed edge portions thereof, respectively, said spacers being arranged in two rows between said plates for maintaining the latter spaced from each other, and a plurality of semiconductor units respectively arranged between said pairs of plates with each pair of cooling plates arranged at opposite sides of and having repsective plate portions engaging a semiconductor unit to support the latter in assembled condition of the semiconductor assembly, said spacers providing means whereby said plate portions, in non-assembled condition of the semiconductor assembly, are situated from each other by distances less than the thickness of said units, so that said pairs of plates respectively grip and support said units with a predetermined pressure in said assembled condition of the semiconductor assembly, said latter pressure providing between said units and said plates a predetermined degree of heat and electrical conductivity, each of said semiconductor units having a pair of opposed end contact surfaces and including a housing having a pair of opposed metallic cover plates electrically insulated from each other and between which said end contact surfaces are situated engaging said cover plates in a manner capable of providing sliding contact between said cover plates and said end contact surfaces, said cover plates having a pair of opposed exterior surfaces situated between and engaging each pair of cooling plates and the cooling plates of each pair including a flat surface engaging one of said cover plates and a convexly curved surface engaging the other of said cover plates at an area thereof which is in alignment with the adjoining end contact surface of the semiconductor unit.

2. An assembly as recited in claim 1 and wherein the opposed end contact surfaces of at least one of said units are of different areas and said convexly curved surface engaging an area of a cover plate which adjoins the smaller of said end contact surfaces.

3. An assembly as recited in claim 1 and wherein said cover plates of each housing are respectively formed with recessed portions receiving and closely conforming to the configuration of said end contact surfaces of each semiconductor unit, and each pair of cover plates of each housing having at said recessed portions thereof exterior surfaces respectively situated in planes displaced from the planes in which other surface portions of said cover plates are situated.

4. An assembly as recited in claim 1 and wherein the cover plate which is engaged by said convexly curved surface is made of a relatively ductile material softer than the material of the cooling plate which has said convex surface so that the latter cover plate will be deformed by and conform to the curvature of said convex surface engaging the latter over a relatively large area.

5. An assembly as recited in claim 4 and wherein said ductile cover plate is made of silver while said cooling plate which has said convex surface is made of hard copper substantially harder than the silver of said latter cover plate.

6. Semiconductor assembly comprising at least one semiconductor unit having a disc-shaped housing including two metallic cover plates insulated from one another, and a semiconductor element slidably disposed between said cover plates, at least two resilient electrically conductive cooling plates having substantially central seat portions in substantially parallel alignment with one another, a plurality of spacer means of insulating material, each of said spacer means located between each of said cooling plates and engaging each of said cooling plates at opposed portions thereof, each of said spacer means having a thickness spacing the seat portions of said resilient cooling plates from one another a distance less than the distance between the cover plates of said semiconductor unit, said semiconductor unit being disposed between the seat portions of said cooling plates so that said cooling plates are stressed in a direction away from one another and said cover plates of said housing are grippingly retained between said substantially central seat portions with a given pressure for affording relatively good thermal and electrical conduction from both sides of said semiconductor element to said cooling plates.

7. Semiconductor assembly according to claim 6, including at least one additional cooling plate spaced from and extending parallel to at least one of said first-mentioned cooling plates, and an intermediate body formed of material having relatively good heat conductivity being sandwiched between said cooling plate and said additional cooling plate.

8. Semiconductor assembly according to claim 6, comprising a plurality of sub-assemblies each including at least two of said cooling plates and one of said semiconductor unit housings disposed therebetween, said sub-assemblies further having identical spacer means for mutually spacing the respective cooling plates thereof and having common clamping means for connecting said sub-assemblies in a rigid column.

9. Semiconductor assembly according to claim 8, wherein said identical spacer means have respective projections on one side thereof and recesses on the opposite side thereof adapted to accommodate the projections of an adjacent spacer means therein.

10. Semiconductor assembly according to claim 9, wherein each of said spacer means is formed with at least two projections located remote from one another, and said cooling plates are formed with corresponding recesses adapted to recess said projections therein.

11. Semiconductor assembly according to claim 9, wherein one of said projections is formed with a bore extending therethrough, the bored projections of said plurality of identical spacer means being aligned with one another so as to define an elongated bored passage, and including a clamping bolt extending through said elongated bored passage.

12. Semiconductor assembly according to claim 6, wherein said substantially central seat portions respectively are defined by a deep-drawn, pan-shaped depression formed in said cooling plates.

13. Semiconductor assembly according to claim 12, wherein said pan-shaped depression is surrounded by a bead-like extension for fixing the position of the semiconductor unit engaging the respective substantially central seat portion.

14. Semiconductor assembly according to claim 6, wherein the seat portion of the cooling plate on one side of said semiconductor unit housing has a flat contact surface, and the seat portion of the cooling plate on the other side of said semiconductor unit housing has a convex contact surface in engagement with the respective cover plates of said housing.

15. Semiconductor assembly according to claim 14, wherein at least the cover plate of said housing in engagement with the cooling plate having said convex contact surface is formed of a relatively ductile material, and the corresponding cooling plate is of a comparatively harder material.

16. Semiconductor assembly according to claim 15, wherein relatively ductile material is silver, and said comparatively harder material is hard copper.

17. Semiconductor assembly according to claim 6, wherein the individual cooling plates are provided at said substantially central seat portions thereof with stiffening inserts.

18. Semiconductor assembly according to claim 6, wherein the individual cooling plates are provided at said substantially central seat portions thereof with a stiffening layer.

References Cited

UNITED STATES PATENTS

| | | | |
|---|---|---|---|
| 3,280,389 | 10/1966 | Martin | 317—234 |
| 2,416,152 | 2/1947 | Braun. | |

ROBERT K. SCHAEFER, *Primary Examiner.*

M. GINSBURG, *Assistant Examiner.*

U.S. Cl. X.R.

317—234